United States Patent [19]

Kwon et al.

[11] Patent Number: 5,090,118
[45] Date of Patent: Feb. 25, 1992

[54] HIGH PERFORMANCE TEST HEAD AND METHOD OF MAKING

[75] Inventors: On-Kyong Kwon, Plano; Masashi Hashimoto; Satwinder Malhi, both of Garland, all of Tex.

[73] Assignee: Texas Instruments Incorporated, Dallas, Tex.

[21] Appl. No.: 560,398

[22] Filed: Jul. 31, 1990

[51] Int. Cl.$^5$ .......................... H01R 9/06; B01R 1/00
[52] U.S. Cl. ........................................ 29/843; 29/846; 324/158 P
[58] Field of Search ............... 329/158 P; 29/843, 852, 29/846; 174/52.4; 437/209

[56] References Cited

U.S. PATENT DOCUMENTS 4,968,589 11/1990 Perry .................. 324/158 P X

FOREIGN PATENT DOCUMENTS 230348 7/1987 European Pat. Off. ............... 29/843
294939 12/1988 European Pat. Off. ............... 29/843
361779 4/1990 European Pat. Off. ......... 324/158 P

OTHER PUBLICATIONS

"P6521 Very High Density High Performance Probe Card", by Tektronix, Inc., copyrighted 1988.
"New Probe Cards Replace Needle Types", by Barsotti et al., Semiconductor International, Aug. 1988, pp. 98-101.
"A Coplanar Waveguide Primer", by Bachert, RF Design, Jul. 1988, pp. 52 and 54.

Primary Examiner—Carl J. Arbes
Attorney, Agent, or Firm—James C. Kesterson; B. Peter Brandt; Richard L. Donaldson

[57] ABSTRACT

A high performance test head (18) communicates test signals between integrated circuit test pads and integrated circuit tester. Test head (18) comprises metal bumps (22) that electrically couple with test pads to communicate test signals between test pads and test circuitry. Planar foundation plate (30) provides structural support. Compliant material layer (26) associates with metal bumps (22) and compresses to assure positive contact between metal bumps (22) and test pads. Compliant material layer (26) is positioned between foundation plate (30) and metal bumps (22). Interconnection line (20) adjoins test head (18) to connect metal bumps (22) between test circuitry and integrated circuits. The present invention includes a method for high performance communication of test signals between test pads and test circuitry. The present invention further includes the method of applying semiconductor device fabrication techniques to produce a high performance test head (18).

3 Claims, 3 Drawing Sheets 5,090,118

HIGH PERFORMANCE TEST HEAD AND METHOD OF MAKING

RELATED APPLICATIONS

The present invention relates to the invention disclosed and claimed in the application Ser. No. 560,404, entitled "DISPOSABLE HIGH PERFORMANCE TEST HEAD" by Aton et al, filed July 31, 1990, and Ser. No. 745,994 entitled "COMPLAINT CONTACT PAD" by Kwon et al, filed Aug. 9, 1991 which is a continuation of Ser. No. 560,936, filed July 31, 1990. Each of these applications are assigned to TEXAS INSTRUMENTS INCORPORATED of DALLAS, TEX.

TECHNICAL FIELD OF THE INVENTION

The present invention relates in general to a high performance test head, and more particularly to an apparatus and method for testing integrated circuits and method for fabricating the apparatus.

BACKGROUND OF THE INVENTION

Both during and following fabrication, integrated circuit manufacturers test the integrated circuits to determine that they satisfy design specifications. These tests typically involve the use of test probe cards that use test heads comprising a plurality of pins. The test pins are usually needles or metal blades that make electrical contact with test pads on the integrated circuits.

Conventional test heads that use needles or metal blades suffer from several limitations. As integrated circuits increase in both size and complexity, both the number of test pads on the circuit and the number of pins on the test head for testing the circuits must increase. Also, the input and output speed of test signals must increase with increasing the speed of devices. With these requirements, conventional integrated circuit testing devices have input/output limitations that are incompatible or insufficient to meet the testing needs of new and more complex integrated circuits. Moreover, as the number of pins increases their likelihood of being misaligned, bent, or shorted together increases.

Consequently, convention test probes that manufacturers use to test complex integrated circuits have short functional lives. Yet another limitation of conventional test heads is that the pins they use are metallic and have significant length relative to their signal wavelengths. As a result, they suffer from capacitance and inductance limitations that reduce the speed of input/output between integrated circuit and the testing circuitry. There are no known ways to reduce this type of parasitic impedance mismatch to thereby increase test signal input/output rates between the integrated circuit and the test circuitry.

Testing systems are also becoming increasingly automated and complex. Automated prober systems for integrated circuits help to reduce operator intervention during the test process. New prober systems offer greater accuracy and longer life, and improve productivity through features such as automatic wafer alignment and profiling. Some of the latest probers incorporate on-line systems which automatically evaluate and correct, if necessary, testing circuitry features such as contact impedance. These systems can accommodate even more complex test probe cards than are presently available.

In an attempt to solve the limitations inherent in conventional integrated circuit test heads, a thin film test probe is described in C. Barsotti et al., "New Probe Cards Replace Needle Types," Semiconductor International, p. 98 (Aug. 1, 1988). That device (the "Barsotti device") produces a high density and high performance and uses a metallic contact pad configuration to provide a more reliable test signal communication path and decrease parasitic capacitance and inductance in test signal transmission. The Barsotti device includes a test probe that comprises an elastomer base with a ground plane and a thin polyimide layer covering the ground plane for insulating the ground plane from the elastomer base. Micro-strip lines cover the polyimide layer and connect to the metallic contact pads. The metallic contact pads engage test pads on the integrated circuit to be tested.

Though the Barsotti device represents and improvement in integrated circuit testing technology, it still suffers from severe limitations. The Barsotti device increases the performance of integrated circuit testing, but at a significantly increased cost to the tester. Other limitations associated with that test include, first of all, that the elastomer based test probe requires the use of nonconventional fabrication techniques. Additionally, the polyimide and ground plane layers of the Barsotti device are bent to provide a protruded surface from which the metallic contact pads can extend.

Consequently, there is the need for an integrated circuit test head that provides high density and high performance integrated circuit testing at a substantially lower cost than known test heads.

There is also a need for an integrated circuit test head that uses known semiconductor device techniques to reliably produce high density and high performance integrated circuit testing.

SUMMARY OF THE INVENTION

According to one aspect of the present invention, there is provided a high performance test head that communicates test signals between a plurality of integrated circuit test pads and test circuitry. The high performance test head comprises a plurality of metal bumps electrically coupled with the test pads to communicate test signals between the test pads and the test circuitry. A planar foundation plate provides structural support. A compliant material layer disposed between the planar foundation plate and the metal bumps compresses to assure positive engagement between the metal bumps and the test pads.

Another aspect of the present invention includes a high performance test head that communicates test signals between a plurality of integrated circuit test pads and test circuitry. The high performance test head comprises a plurality of metal bumps that communicate test signals between the integrated circuit test pads and the test circuitry by electrically joining with the test pads. A planar foundation plate assists positioning the metal bumps relative to the test pads. A compliant material adjoins the metal bumps to absorb relative placement differences between the test pads and the metal bumps as the metal bumps join with the test pads. The compliant material layer adjoins the foundation plate and the metal bumps.

According to yet another aspect of the present invention, there is provided a method for fabricating a high performance test head to communicate test signals between a plurality of integrated circuit test pads and test circuitry. The method comprises the steps of forming a rigid foundation plate. A ground plane is adhered to the foundation plate. A compliant material layer is spin-coated over the wafer and the ground plane. The compliant layer is soft-cured and wet etched at its periphery. Then, the compliant layer is hard-baked and metallized so that metal lines are patterned on the compliant layer that connect to the test circuitry. A plurality of metal bumps are formed on the compliant layer in contact with the metal lines. The metal bumps associate with the location of the test pads of the integrated circuit which the test head is designed to test.

A technical advantage of the present invention is that it provides an integrated circuit test head that can easily communicate test signals between test circuitry and complex large scale integrated circuits.

As another technical advantage, the present invention provides the ability for integrated circuit test input and output data rates that far exceed conventional integrated circuit test probe input/output rates. Therefore, the integrated circuit test head of the present invention can easily accommodate increases in the complexity of integrated circuit testing circuitry.

Another technical advantage of the present invention is that it provides a high speed integrated circuit test head that is economical to produce.

Still a further technical advantage of the integrated circuit test head of the present invention is that it employs known semiconductor device fabrication techniques.

A technical advantage of the present invention is that it provides an integrated circuit test head that can be batch manufactured economically and in large quantities.

BRIEF DESCRIPTION OF THE DRAWINGS

The invention, as well as modes of use and further advantages, is best understood by reference to the following description of illustrative embodiments when read in conjunction with the accompanying drawings.

DETAILED DESCRIPTION OF THE INVENTION

The preferred embodiment of the present invention is best understood by referring to the FIGS. 1-6 which use like numerals for like and corresponding parts of the various drawings.

Figure 1:
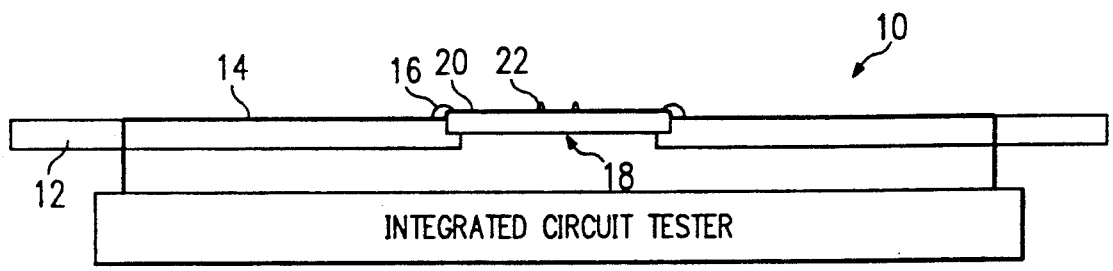
FIG. 1 shows a cross-sectional view of a test probe card that incorporates the high performance test head according to a preferred embodiment of the present invention.

FIG. 1 provides a cross-sectional view of the probe card 10 that employs a preferred embodiment of the test head of the present invention. According to FIG. 1, the present invention comprises probe card interface board 12 which connects to the test circuitry (not shown). Metal line 14 adheres to interface board 12. Wire bonding 16 connects to test head 18. Test head 18 contains interconnect lines 20 that lead to metal bumps 22. Metal bumps 22 engage integrated circuit test or input/output pads (not shown).

Probe card interface board 12 supports high performance test head 18 of the present invention. A conventional printed wire board card with only slight modifications can serve as interface board 12 to support the operations of the high performance test head 18.

Figure 2:
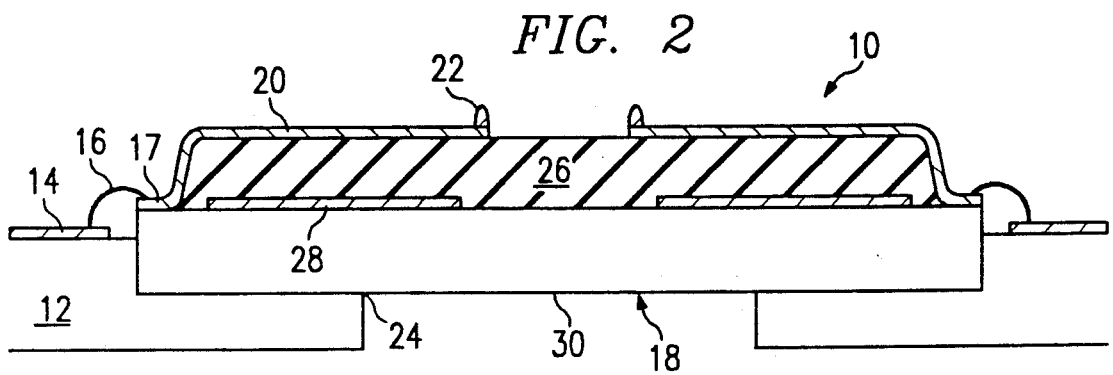
FIG. 2 provides a cross-sectional view of the high performance test head according to a preferred embodiment of the present invention.

FIG. 2 provides a cross-sectional view of a preferred embodiment of the high performance test head 18 of the present invention. In FIG. 2, interface board 12 supports metal line 14 from which wire bonding 16 taps at bonding pad 17. Test head 18 also adheres to interface board 12 at setting 24. Test head 18 comprises interconnect lines 20 which connect between wire bonding 16 and metal bumps 22. Beneath interconnection line 20, compliant layer 26 lies. Compliant layer 26 covers ground plane 28 which adjoins foundation plate 30. Foundation plate 30 adjoins interface board at setting 24.

Interconnection lines 20 employ wire bonding 16 to connect to interface board 12. Wire bonding 16 is protected by an epoxy resin or other electrically insulated material. The height of wire bonding 16 should be lower than the top of the test head 18. This ensures that wire bonding 16 will not touch the integrated circuit during testing. The height of the bonding pads 17 to which wire bonding 16 connects, should also be lower than the height of metal bumps 22. To accommodate this design, the high performance test head 18 of the present invention employs a cut out edge at compliant material layer 26. Etching compliant material layer 26 with a conventional semiconductor device fabrication etching process can produce the desired edge cut out.

In a preferred embodiment of the present invention, interconnection line 20 has a thickness of 1 to 1½ μm, and may be a gold or other material having similar conductive properties. Metal bumps 22 have a height of approximately 2 mils and are of tungstenized gold. Compliant layer 26 is a polyimide layer having a thickness of approximately 2 μm. Ground plane 28 is of a gold material approximately 1 μm thick. Foundation plate 30 is quartz wafer approximately 10–20 mils thick. Other materials that provide both the translucent character of a quartz and rigid support structure necessary to support polyimide layer 26 are equally useful for this purpose.

Compliant material layer 26 provides for planarity adjustments of test head 16 to ensure positive engagement of metal bumps 22 with test pads of the integrated circuit. Because compliant material layer 26 is a resilient material that absorbs minor variations in planarizing and contact bump height, the need for adjustments throughout the entire lifecycle of the probe card is virtually eliminated. While compliant layer 26 comprises polyimide in the preferred embodiment, it may be formed of any electrically-insulated compliant material that has the necessary compliant or resilient properties to assure positive contact of metal bumps 22 with the integrated circuit test pads.

Metal bumps 22 should be of a hard metallic material. For instance, the preferred embodiment uses a tungstenized gold. Metal bumps 22 should have a sharp edge that will penetrate any oxide layers that may exist on the integrated circuit test pads to assure positive electrical contact for transmitting and receiving test signals between the integrated circuits and the test circuitry. With this design for metal bumps 22, test head 18 of the present invention may be at least five times more reliable than conventional test probes that use needles and blades.

The pattern of metal bumps 22 is unique to each integrated circuit die size of test pad configuration. The metal bumps 22 are advantageous over needles and blades, since they will not become misaligned, bent or short-circuited. Further, since they allow the use of lower contact forces (1 gram/pad versus three to five grams/pad), which cause less damage to die pads.

Figure 3:
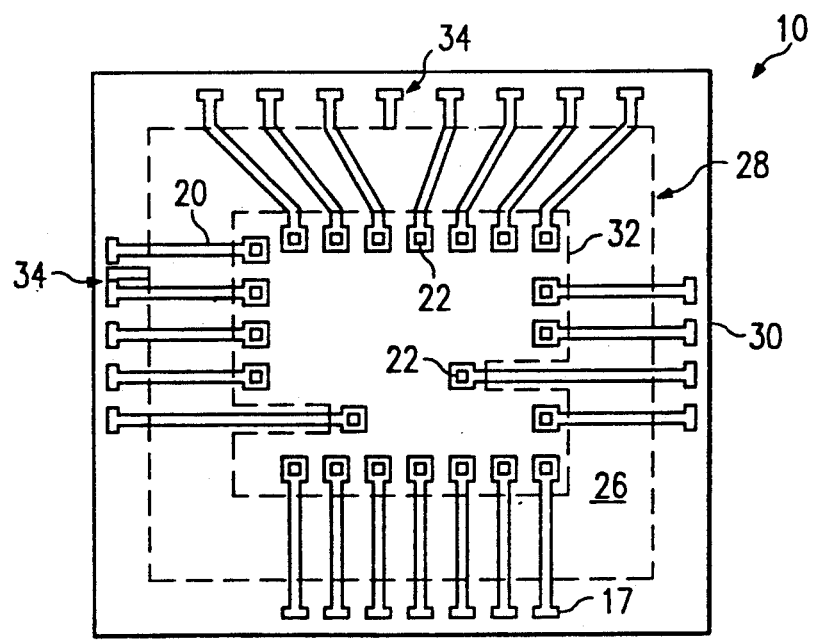
FIG. 3 shows a top planar view of the face of a preferred embodiment of the high performance test head of the present invention.

FIG. 3 provides a top planar view of the high performance test head 18 of the present invention. FIG. 3 shows foundation plate 30 covering ground plane 28. Cut from ground plane 28 is window 32. Covering ground plane 28 is compliant material layer 26. Metal bumps 22 connect to interconnection lines 20 that cover compliant material layer 26 and connect to bonding pads 17. Ground paths 34 connect to ground plane 28.

For integrated circuit testing, foundation plate 30 is of optically transparent quartz material and window 32 is cut into ground plane 28 to permit easy alignment of metal bumps 22 with the test pads of the tested integrated circuit. For this purpose, compliant material layer 26 must also be of a transparent material, such as polyimide.

There are several considerations in the design of high performance test head 18 of the present invention. The overall signal path from the test pads of an integrated circuit to test head 18 and onto the testing circuitry has several electrical discontinuities. These discontinuities appear in the electrical line circuit that includes metal bumps 22, interconnection line 20, bonding pads 17, wire bondings 16, metal lines 14 and the connectors on interface board 10 between metal lines 14 and the integrated circuit tester.

Between these discontinuities, however, the components of the test head 18 and the metal line 14 of interface board 12 may provide maximal signal integrity and accuracy. For example, the impedance of interconnection lines 20 and metal lines 14 can be precisely controlled. Using known micro-strip line structure or co-planar structure techniques, it is easy to design metal lines 14 and interconnection lines 20 to have controlled impedances. Applying these techniques, it is possible to produce transmission lines having little or no signal degradation.

Figure 7:
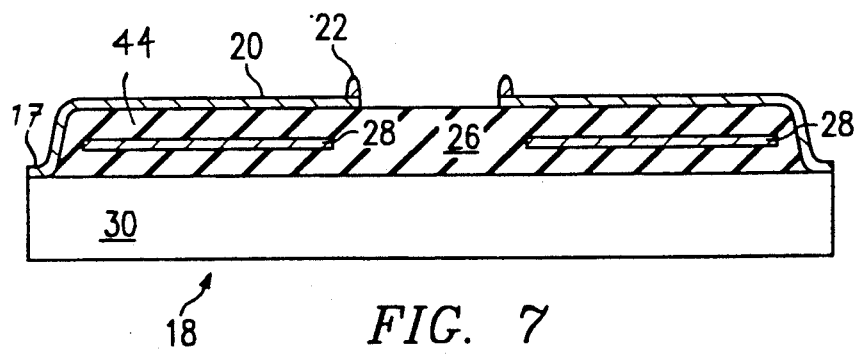

In practice, because most integrated circuit testers are matched on a 50 $\Omega$ impedance line, the high performance test head of the present invention should use 50 $\Omega$ impedance lines for interconnection lines 20 and metal lines 14. For high I/O counts chip, ground plane will be placed between polyimide layers (as shown in FIG. 7) in order to have enough compliance and 50 $\Omega$ impedance lines.

Because metal bumps 22, are much smaller than pins that conventional test probes use, signal reflection of metal bumps 22 is negligibly small. Use of high frequency connectors between interface board 12 and the testing circuitry is helpful to even further minimize signal reflection. With high performance test head 18 of the present invention, only wire bonding 16 produces degradation and signal reflection of any significance during integrated circuit testing. Using known techniques that assure high signal transmission integrity and to provide wire bonding 16 proper ground plane arrangement, however, wire bonding 16 inductance can be reduced to 0.3 to 0.5 nH for a single wire.

In a typical configuration, the impedance of a single wire bonding 16 is less than 3.75 $\Omega$ at 2 GHz. If the test probe uses double or triple wires for wire bondings 16 for each pad, the impedance of the bonding wire can be further minimized. This approach permits signal reflection at 2 GHz to be reduced to as little as 1.24% of the signal. For input/output frequencies greater than 2 GHz, however, serial noise and crosstalk noise limit the number of input/outputs.

The maximum clock frequency of present very large scale integrated circuits is less than 200 MHz, since the design of interconnection line 20 and metal bumps 18 each may accommodate frequencies up to the tenth harmonics (i.e., having a bandwidth limit of at least 2 GHz for a 1 cm. $\times$ 1 cm. chip), the test head 18 of the present invention has use for present and future VLSI circuits.

The level of performance of test head 18 of the present invention allows test circuitry using test head 18 to perform AC timing measurements at the wafer level and reject faulty dies prior to packaging. For example, a test probe using test head 18 would be well suited to wafer probing applications involving high performance devices such as GaAs, ECL, CML and high speed CMOS, and devices with slew rates faster than 1 V/ns.

Figure 4:
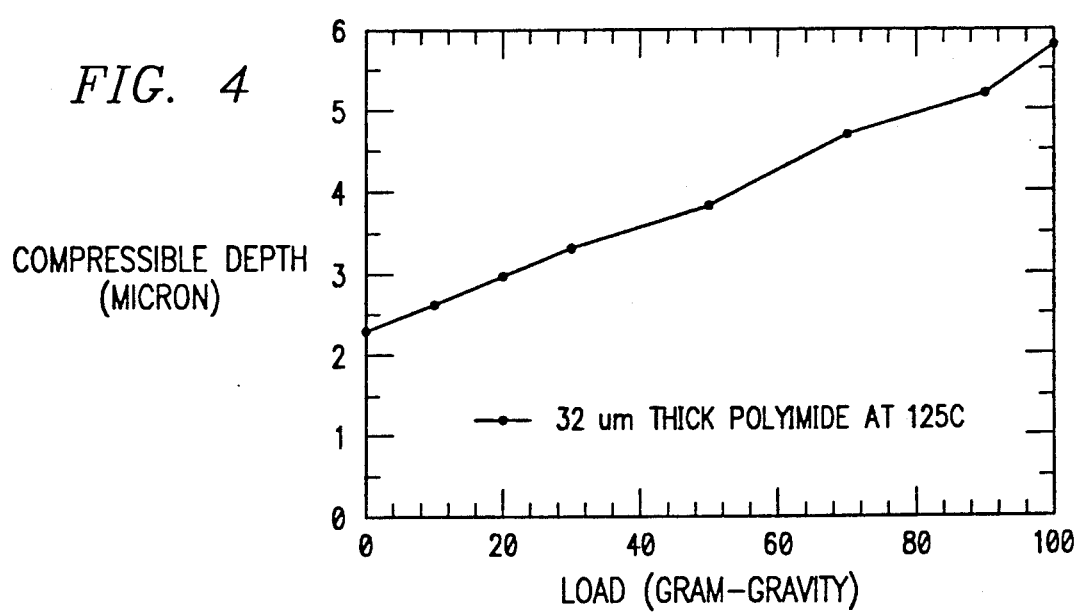
FIG. 4 is a plot of compressible depth versus load for a polyimide film of the type used in a preferred embodiment of the present invention.

A particularly important feature of the present invention is the ability of compliant layer 26 to absorb planar differences between metal bumps 22 and the integrated circuit test pads. FIG. 4 demonstrates the ability of a polyimide layer to provide this feature. FIG. 4 shows the measured compressible depth of a 32 $\mu$m thick hard baked polyimide film at 125° C. plotted against pressure applied to the layer. In this test, a 0.89 mm diameter indentor tip measures the compressible depth of the polyimide layer. As a result, 1 gram-gravity load corresponds to a pressure of 15.753 KPa. It is known that a pressure of 4 gram-gravity/probe-pin, assuming mil diameter probe pin with a pressure of 77 MPa, is usually required in order to penetrate the thin aluminum-oxide layer on aluminum pads. Within these parameters, the compressible depth of 32 $\mu$m thick polyimide film is more than 6 $\mu$m for the test head application of the present invention. Assuming that the gap distance between the integrated circuit pads on a chip and metal bumps 22 on test head 18 due to a bump height difference, surface roughness and metal stress is less than 5 $\mu$m when the test head 18 touches a semiconductor wafer and the 6 $\mu$m compressible depth of a 32 82 m thick polyimide film satisfies the necessary compressibility requirements of the present invention. To ensure that a polyimide layer satisfies the compressibility requirements of compliant layer 26 the layer thickness should be greater than 25 $\mu$m.

A technical advantage of the present invention is its ability to be manufactured by known semiconductor device fabrication processes. FIGS. 5a through 5e show the various steps that result in the high performance test head 18 of the present invention.

Figure 5A:
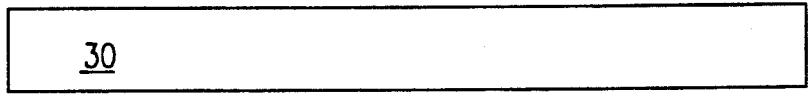
FIGS. 5a-e provide details of a preferred method of fabricating the high performance test head of the present invention.

The starting material for the test head 18 is a rigid transparent material such as quartz or glass, as FIG. 5a shows, to form foundation plate 30.

Figure 5B:
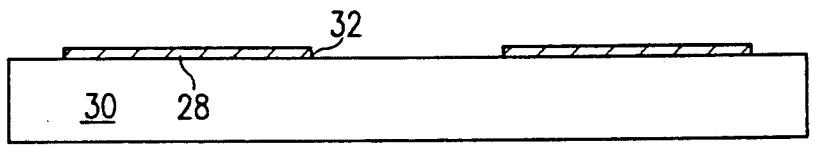
Figure 5C:
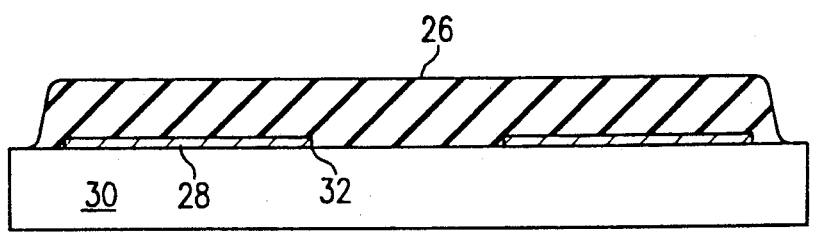
Figure 5D:
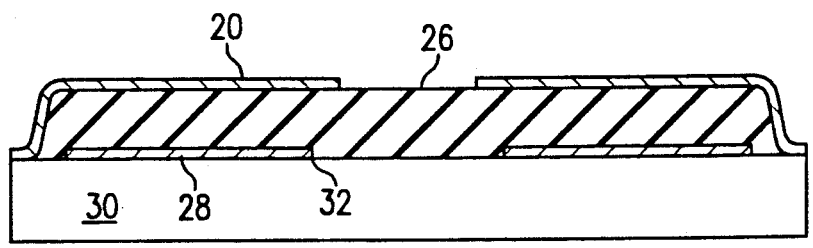
Figure 5E:
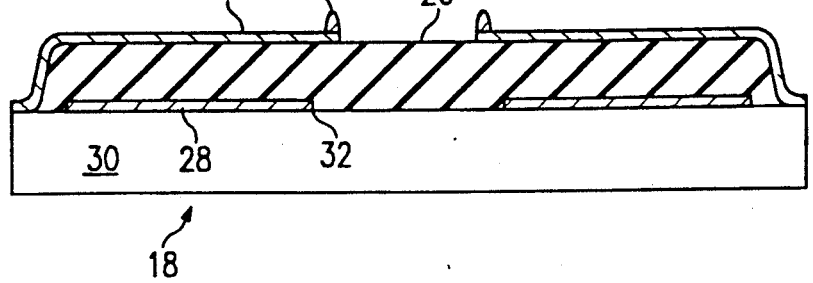

In FIG. 5b, the foundation plate 30 is metallized to form ground plane 28. A portion of the metallization layer is removed to provide a window area 32 that permits alignment of high performance test head 16 at the periphery of the integrated circuit to be tested. Metal etching a the center of the test head 18 can form window 32. In FIG. 5c, polyimide film 26 is spin-coated over transparent foundation plate 30 and is soft-cured. To obtain a surface conducive to placing metal interconnection lines 20 on the polyimide film 26, a slow slope 34 is wet etched or dry etched at the periphery of polyimide layer 26. In FIG. 5d, the polyimide film 26 is metallized, typically by deposition, and is subsequently patterned and etched to form the metal interconnection lines 20 on polyimide film 26. Finally, the metal bumps 22 are formed at points on interconnection lines 20 that associate with test pads on the integrated circuit chip. The result is the test head 18 of the present invention are shown in FIG. 5e.

Using this fabrication technique, which applies known semiconductor device fabrication processes, to produce the high performance test head of the present invention can reduce production costs to a fraction of those for known high density and high performance integrated circuit test heads.

Figure 6:
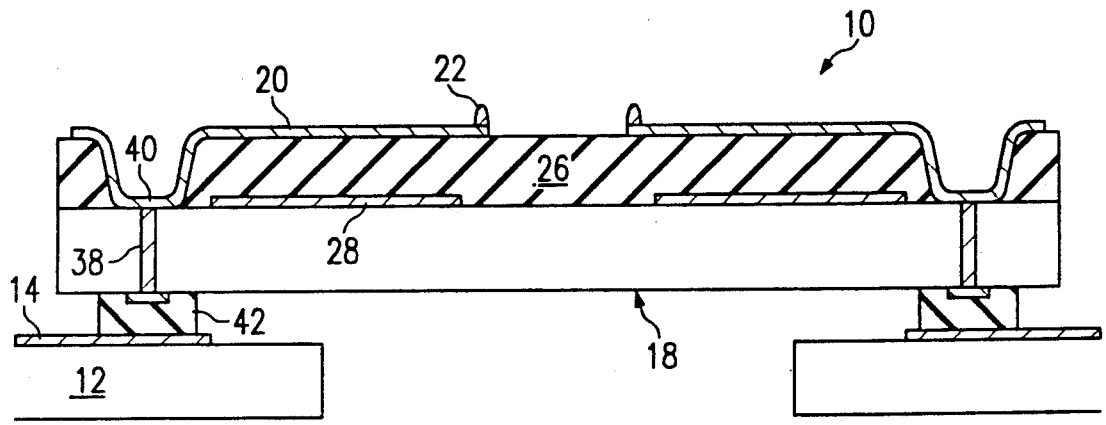
FIG. 6 provides an alternative embodiment of the present invention that uses plated-through holes and electronic contacts.

FIG. 6 provides an alternative assembly cross-section using plated-through holes 38 and elastomeric contacts 42 for easy assembly and disassembly. In FIG. 6, metal bump 22 connects to interconnection line 20 which taps to interconnecting pin 40 through compliant layer 26. Compliant layer 26 covers ground plane 28, which both cover quartz foundation plate 30. Interconnection path 40 penetrates quartz foundation plate 3 through plated-through hole 38. Interconnection path 40 adjoins elastomeric conductor 42. Elastomeric conductor 42 contacts metal line 14 which adjoins interface board 12.

Fabrication of the alternative embodiment of the present invention is similar to that of the preferred embodiment. The alternative embodiment, however, requires the use of a laser drill to create holes 38 in quartz foundation plate 30. Following laser drilling, fabrication entails plating through holes 38 to produce metal pins 40. Elastomeric conductors 42 may be added to absorb no planarity between metal path 40.

FIG. 7 shows yet another embodiment of the present invention in which ground plane 28 is disposed within polyimide layer 26 and separated thereby from foundation plate 30. In this embodiment, the total thickness of polyimide layer 26 provides the necessary compliant for the purposes of the present invention. The thickness of the top portion 44 polyimide layer 26 and the signal line 20 wide may be adjusted to appropriately adjust and contact transmission impedance. If the thickness of top portion 44 decreases, then the signal line 20 width of 50 Ω impedance lines can be decreased. Therefore, this embodiment has particular use in the case of high input/output count integrated circuit applications.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A high performance test head for communicating test signals between a plurality of integrated circuit test pads and integrated circuit tester, comprising:
    a planar foundation transparent plate for providing structural support;
    a compressible and compliant material layer covering and at least partially in contact with said foundation plate, said compliant material layer including an upper surface;
    a ground plane below said upper surface and covered by said compliant material;
    interconnecting conductive metal lines in contact with said upper surface of said compliant material; and
    a plurality of metal bumps bonded to and selectively in electrical contact with said interconnecting lines for contacting test pads of an integrated circuit.

2. A method of fabricating a high performance test head for communicating test signals between a plurality of integrated circuit test pads and test circuitry, comprising the steps of:
    metallizing a structural support transparent wafer to form a metal ground plane;
    metal etching a window area within said ground plane material;
    spin-coating a compliant material layer over said structural support wafer and said ground plane;
    soft-curing said compliant material layer;
    hard-baking said compliant material layer;
    metallizing said compliant material layer to form thereon a conductive metal layer;
    patterning interconnection lines from said conductive metal layer; and
    forming a plurality of metal bumps on said compliant material layer, said metal bumps associated with said interconnection lines to permit association of said metal bumps with the test pads of the integrated circuit.

3. The method of claim 2, further comprising the step of wet etching said compliant material layer to form a sloped periphery, thereby forming a layer conducive to metallizing said compliant material layer to form said interconnection lines.

* * * * *